US007783438B2

(12) United States Patent
Redko et al.

(10) Patent No.: US 7,783,438 B2
(45) Date of Patent: Aug. 24, 2010

(54) INTEGRATED NON-DESTRUCTIVE METHOD AND DEVICE FOR ELECTROCHEMICAL ENERGY SYSTEM DIAGNOSTICS

(75) Inventors: Volodymyr Redko, Coral Springs, FL (US); Volodymyr Khandetskyy, Dnipropetrovsk (UA); Elena Shembel, Coral Springs, FL (US)

(73) Assignee: Enerize Corporation, Coral Springs, FL (US)

( * ) Notice: Subject to any disclaimer, the term of this patent is extended or adjusted under 35 U.S.C. 154(b) by 287 days.

(21) Appl. No.: 11/980,232

(22) Filed: Oct. 30, 2007

(65) Prior Publication Data
US 2008/0133156 A1 Jun. 5, 2008

Related U.S. Application Data

(60) Provisional application No. 60/855,693, filed on Oct. 31, 2006.

(51) Int. Cl.
*G01R 31/36* (2006.01)
*G01N 37/00* (2006.01)
*G01N 27/416* (2006.01)

(52) U.S. Cl. .............................. 702/63; 702/84; 324/426
(58) Field of Classification Search .................. 702/63, 702/84
See application file for complete search history.

(56) References Cited

U.S. PATENT DOCUMENTS 5,093,624 A * 3/1992 Stevenson .................... 324/426
6,520,018 B1 * 2/2003 Flores-Lira .................... 73/629

FOREIGN PATENT DOCUMENTS

JP 2005291832 A * 10/2005

\* cited by examiner

*Primary Examiner*—Bryan Bui
*Assistant Examiner*—Jonathan Teixeira Moffat
(74) *Attorney, Agent, or Firm*—Sharill & Vatooma PLC

(57) ABSTRACT

The present invention is an integrated method and apparatus for determining the quality of electrochemical energy storage devices, especially batteries. The invention is based on an integrated usage of electromagnetic and ultrasonic energy to probe of the interior volume of the battery. The first probe is carried out when the battery is at an initial charged state. After the first probe stage, a discharge of the battery being diagnosed is carried out until the test battery is at a small fixed test charge value. Signals from the eddy current probes allow determination of the continuity of the discharge current during the discharge process. After the discharge of the battery, the above described test sequence is repeated.

The resultant eddy current signal generated at the initial state of the battery and the gradients of the eddy current signal and of the ultrasonic signal versus the battery capacity is determined. Deviations of these parameters from the corresponding average values preliminary obtained on the training sample set of batteries is calculated. Probability density function binary signals are formed for deviations of parameters used. The batteries being diagnosed are rejected by means of using the obtained binary signals with their probability values and a logical rule set.

37 Claims, 5 Drawing Sheets

$$\frac{\Delta R_r}{R_{r(init)}}, \%$$

INTEGRATED NON-DESTRUCTIVE METHOD AND DEVICE FOR ELECTROCHEMICAL ENERGY SYSTEM DIAGNOSTICS

CROSS-REFERENCE TO RELATED APPLICATIONS

Claims priority of Provisional Patent Application No. 60/855,693, Filed Oct. 31, 2006

FEDERALLY SPONSORED RESEARCH

None

SEQUENCE LISTING

None

FIELD OF THE INVENTION

This invention relates to quality testing of batteries and the like, and specifically to the use of combined eddy current and ultrasonic methods and corresponding device for rapid determination of quality and charge state of batteries.

BACKGROUND

As batteries become more widely used as electrical power sources in a wide range of devices, the ability to determine the condition of a battery (including charge state) is of increasing value. Such is especially the case when the batteries are to be used in mission critical applications where they cannot be readily accessed or replaced and where battery failure would incur unusually high costs. Such applications are myriad and might include remotely located sensor equipment, satellites, smart weapons, medical and communications equipment and so forth.

The most common means of determining the condition and charge state of batteries at present is to monitor its electrical potential. This method is of limited value for batteries that have flat discharge curves, because battery voltage begins to drop only near the end of the discharge cycle, and thus cannot be reliably used to determine condition or amount of energy available during the current discharge cycle.

The present invention allows accurate determination of battery charge state, as well as the overall condition, and hence the reliability, of the battery.

BRIEF DESCRIPTION OF THE INVENTION

The integrated method and device of the present invention allows determination of battery quality. The present invention is based on the combined use of electromagnetic and ultrasonic excitation of the entire battery being tested. Analyses of eddy current and ultrasonic signals are used to probe the inner volume of the battery in the initial charged state.

After the first probing stage, a discharge of the battery being diagnosed is carried out to bring the battery to a small fixed test charge value (a specific fraction of full charge capacity). During this process the signals of the eddy current probes are used to determine the continuity of the discharge current. After the discharge process is finished, ultrasonic and eddy current testing of the battery is repeated.

The deviations of the eddy current signal obtained in the initial state of the battery being tested, and of the gradients of the eddy current and of the ultrasonic signals versus the battery capacitance, are determined relative to the average values preliminary obtained on the "training set" of batteries.

From the items of the training set, a defect subset is formed. The defect set includes the batteries subjected to an artificial discharge to a specific fraction of the initial capacity of the battery, with each part having a value that is proportional to its ordinal number in the defect set.

Using the batteries from the defect set, the functions for the probability density are determined for the deviations of the eddy current signal obtained in the initial state of the battery and of the gradients of the resulting ultrasonic and eddy current signals.

When the deviation values of the eddy current resultant signal obtained in the initial state of the battery, and of the gradients of the ultrasonic and of the eddy current resultant signals exceed the corresponding thresholds, separate binary signals are formed while each of these signals has a probability that is determined according to the corresponding probability density function.

The decision as to whether to reject the specific battery being tested is made using the obtained binary signals and logic rules.

DETAILED DESCRIPTION OF THE INVENTION

The present invention comprises an integrated method and device and for determining the quality of batteries. In practice, the method component of the invention comprises can be carried out as follows. The inner volume of a battery found in its initial charged state is probed with ultrasonic pulses in a high-frequency shadow fill mode by using ultrasonic probes containing polyurethane couplers (protectors) for ultrasonic energy injection. The inner volume of the battery found in its initial charged state is also probed with an eddy magnetic field by using eddy current probes spatially integrated with ultrasonic probes and arranged on both sides of a flat (prismatic) battery.

The battery being diagnosed is then discharged to a low fixed test charge value while using the signals of the eddy current probes for determining the continuity of the discharge current during the test discharge process. After the test discharge, the battery is probing with ultrasonic pulses, and the eddy current signals from the battery are determined using eddy current probes after the testing discharge, thus forming of a resultant eddy current signal.

The deviation of the resultant eddy current signal generated at the initial state of the battery being diagnosed from the average state of the same signal preliminary obtained on the training sample set of batteries. The plot of ultrasonic signal gradient versus the battery capacity is then determined as is the gradient of the resultant eddy current signal versus the battery capacity. Deviation of the ultrasonic signal gradient for the battery being diagnosed from the average gradient value preliminary obtained on the training sample of batteries is then determined, as is the deviation gradient of the resultant eddy current signal for the battery being diagnosed from the average gradient preliminary obtained on the training sample set of batteries.

A set of probability density functions for the deviations of the eddy current resultant signal obtained in the initial state of the battery, and the gradients of the ultrasonic and eddy current resultant signals; is then created.

This yields a binary signals for the deviations of the resulting eddy current signal obtained in the initial state of the battery, and the gradients of the ultrasonic and eddy current resultant signals while using the corresponding threshold for determining the probabilities of the obtained binary signals from the battery being diagnosed. Base on the resulting binary signal and associated logic rules, the battery being tested can either be accepted as of adequate quality or rejected.

Figure 1:
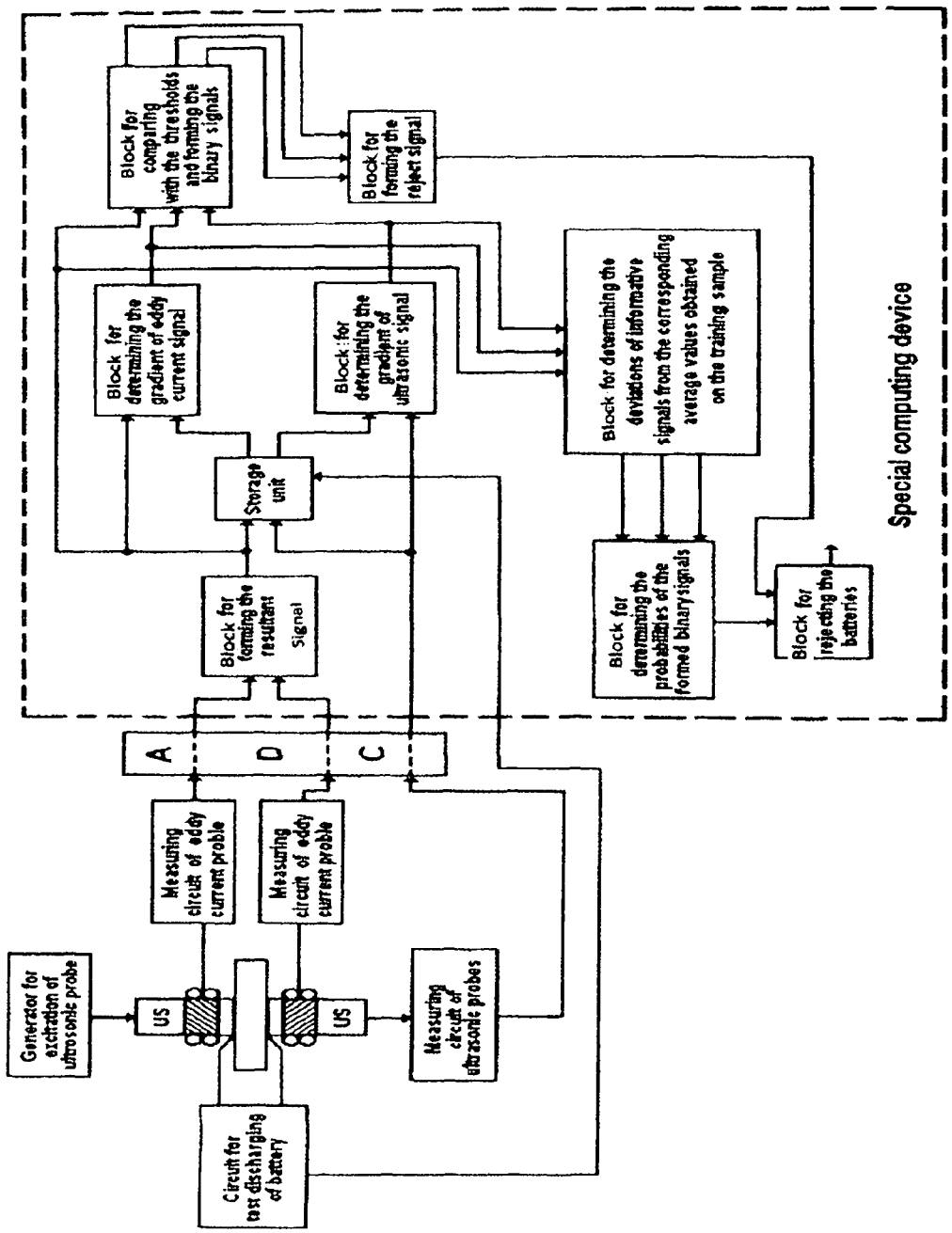
FIG. 1. Block diagram showing the main components of the present invention.

A functional diagram of the device for battery quality diagnostic is shown in FIG. 1. The device comprises integrated measuring transducers arranged on both sides of a flat battery that correspondingly contain an emitting (or transmitting) and a receiving ultrasonic probes with polyurethane protectors, and parametric eddy current probes integrated with the ultrasonic probes into a single structure, as well as contacts for testing discharge of the batteries.

To the outer end face of the dielectric casing of each inductance coil, a thin metallic plate is affixed in the form of a split ring and having a current tap. The cylindrically shaped polyurethane protector protrudes above the level of the outer surface of the plate fixed to the end face of the dielectric casing.

The device of the present invention further comprises unit (designated as a circuit or block) for discharging of batteries that serves to connect of the discharge contacts to a resistive load during the specified time interval, as well as a generator for excitation of the ultrasonic probes. The device includes a measuring circuit for the ultrasonic probe, the first and the second measuring circuits for the eddy current probes, an analog-to-digital converter, a block (or circuit) for forming a resultant signal of the eddy current probes, a data storage unit, a means for determining the gradient of eddy current signal, a means for determining the gradient of ultrasonic signal, and a means for determining the deviations of the resultant signal of eddy current probes and the gradients of the eddy current and ultrasonic signals from the corresponding average values obtained on the training sample.

The device also includes a unit (circuit or block) for comparing with the thresholds and for forming the signals of binary logic, a means for forming the rejection signals, a means for determining the probabilities of the formed binary signals, and a means for rejecting batteries that are not of adequate quality according to the operation and logic rules of the device.

Figure 2:
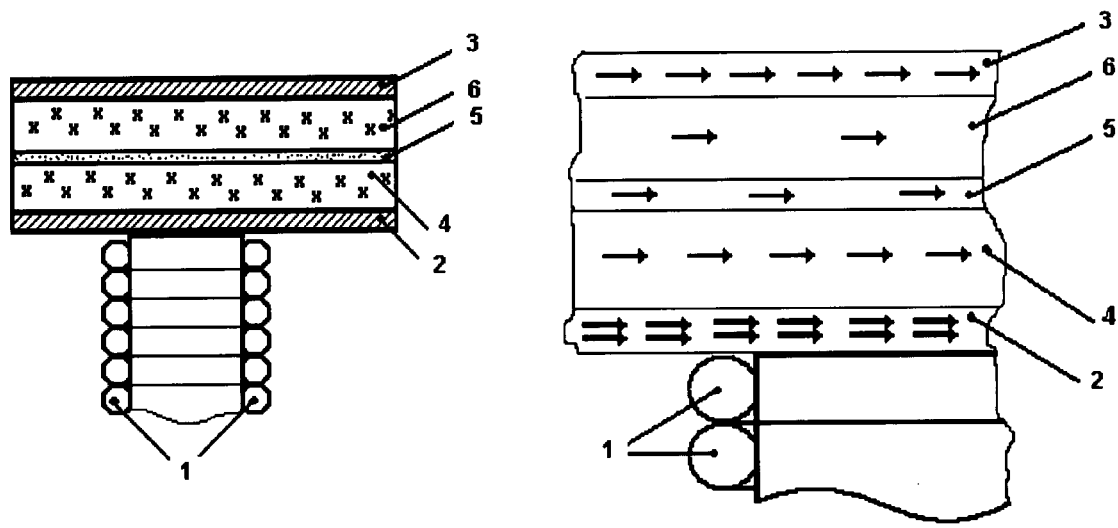
FIG. 2. Diagram showing placement of the battery on the eddy current probe: 1—windings of the eddy current probe, 2 and 3 are cross section view of the battery case, 4 is the anode material, 5 is the separator with electrolyte, 6 is the cathode material.

A detailed description of the invention is provided in terms of a specific application example. This example illustrates the results obtained on three silver-zinc batteries designated as $A_1$, $A_2$, and $A_3$. The diameter of the batteries is 10 mm, and battery thickness is 5.4 mm. Battery capacity is Q=150 ma·h. The batteries were studied using a probing magnetic field to produce eddy currents (FIG. 2) and an ultrasonic method.

Table 1 shows the results of analysis of the batteries in their initial charged state using an eddy current method.

Here f, is in MHz and is the frequency of the probing (excitation) eddy magnetic field. $R_{ad}$ is the real part of the impedance introduced into the eddy current probe (reactance), $\omega L_0$ is the self reactance of the probe, $R^r = R_{ad}/\omega L_0$. The numeric index designates the number of battery.

Figure 3:
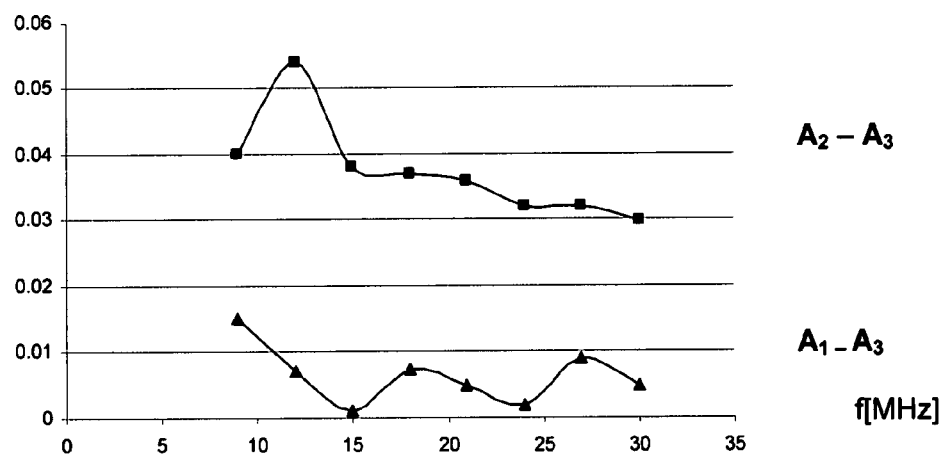
FIG. 3. Frequency dependencies for batteries with T=5.4 mm in initial state.

Table 1 shows that the values $R_2^r$ (for battery $A_2$) obtained at the initial state of the battery substantially exceed the values of the corresponding parameters for batteries $A_1$ and $A_3$ at all frequencies, while the values of these parameters for batteries $A_1$ and $A_3$ are approximately equal (FIG. 3).

TABLE 1

Eddy current method results from tests on batteries in their initial charged state.

| f, MHz | $(R_{ad}/\omega L_0, \%)_1$ | $(R_{ad}/\omega L_0, \%)_2$ | $(R_{ad}/\omega L_0, \%)_3$ | $(R^r_2 - R^r_3)$, % | $(R^r_1 - R^r_3)$, % |
|---|---|---|---|---|---|
| 9 | 1.544 | 1.569 | 1.529 | 0.04 | 0.015 |
| 12 | 1.267 | 1.314 | 1.260 | 0.054 | 0.007 |
| 15 | 1.089 | 1.126 | 1.088 | 0.038 | 0.001 |
| 18 | 0.947 | 0.978 | 0.941 | 0.037 | 0.006 |
| 21 | 0.833 | 0.864 | 0.828 | 0.036 | 0.005 |
| 24 | 0.744 | 0.774 | 0.742 | 0.032 | 0.002 |
| 27 | 0.674 | 0.697 | 0.665 | 0.032 | 0.009 |
| 30 | 0.587 | 0.612 | 0.582 | 0.03 | 0.005 |

Then a test discharge was performed on batteries $A_1, A_2, A_3$ with a current of I=15 mA over a period of 6 minutes. The initial capacity of each battery was reduced in this case by 1%. After disconnection the battery from the load resistor, the charge of the battery is restored within a short time interval due to electrochemical processes in the battery (chemical power source).

Figure 4:
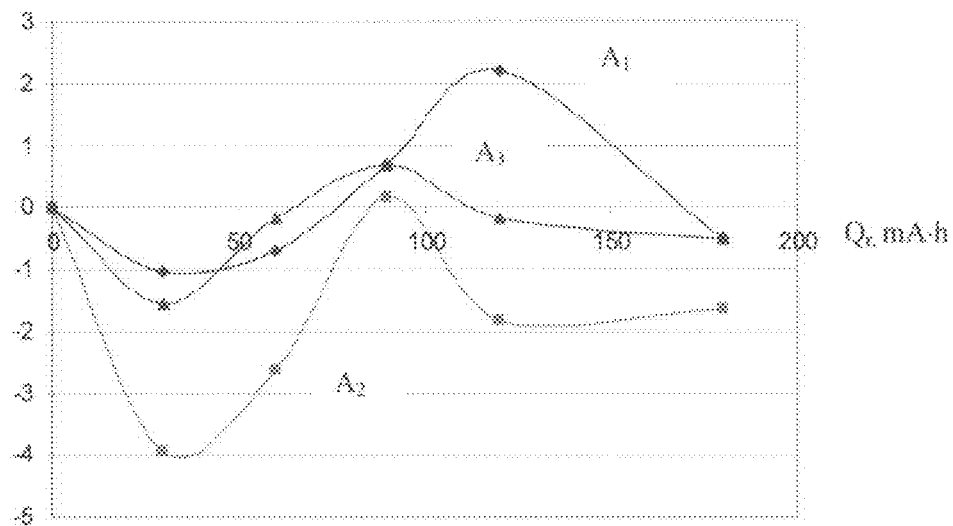
FIG. 4. Dependencies of the difference of the reactance of the eddy current probe $R_r=R_{ad}/\omega L_0$ normalized to the initial value of the $R_r$ ($Q_r=0$) of the decreasing battery capacity: $A_1$, $A_2$, $A_3$ are the numbers of the batteries with T=5.4 mm. Dependencies are defined at a frequency of f=30 MHz.

Dependencies of the difference of relative reactance of the eddy current probe $R_r = R_{ad}/\omega L_0$ normalized to the initial value of the $R_r$ ($Q_r=0$) on the decreasing battery capacity: $A_1$, $A_2$, $A_3$ are the numbers of batteries with T=5.4 mm. Dependencies are defined at the frequency f=30 MHz (FIG. 4).

Following the test discharge, the eddy current and the ultrasonic measurements were repeated. The changes of parameter $R_2^r$ in comparison to the initial state (gradient $R_2^r$) were as follows: for battery $A_1$; 0.12%, for battery $A_3$; 0.14%, for battery $A_2$; 0.40%. The corresponding changes of the ultrasonic signal amplitude compared to the initial state (amplitude gradient) were as follows: for battery $A_1$, the change was 0.35%, for battery $A_3$ it was 0.36%, and for battery $A_2$ is was 0.12%.

Figure 5:
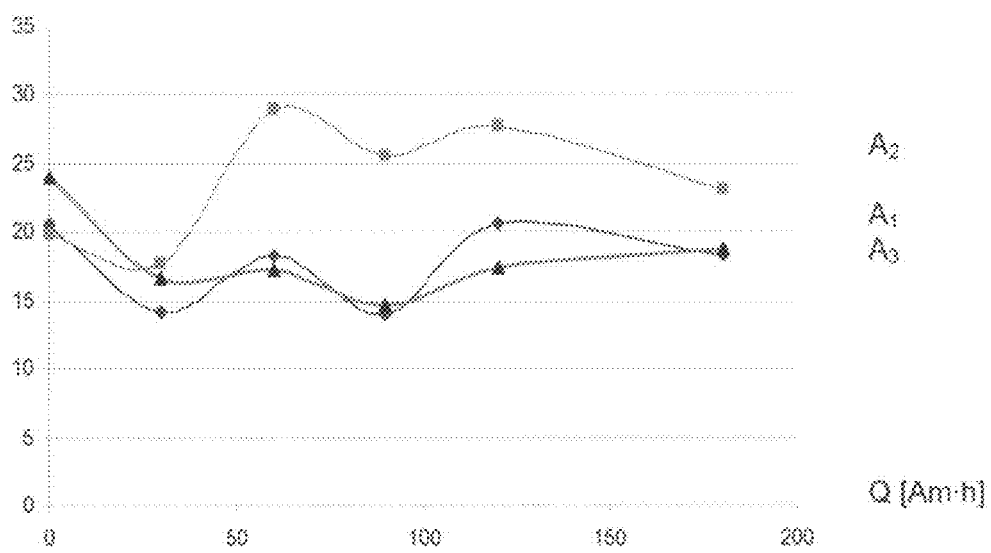
FIG. 5. Dependence of the amplitude of the ultrasonic signal passed through a battery of thickness T=5.4 mm on the capacity when connected to a load. Markings $A_1$, $A_2$, $A_3$ are designated the numbers of batteries being tested.

Dependences of the amplitude of the ultrasonic signal passed through a batteries of thickness T=5.4 mm on the capacity passed to a load are showed in FIG. 5.

Subsequent discharging of the batteries with current I=15 MA showed that the voltage on the current outlets of battery $A_2$ was maintained constant during 2 hours, while during the subsequent 2 hours it dropped to zero. In contrast to the above, the voltages on the current outlets of batteries $A_1$ and $A_3$ remained practically constant during 8 hours, whereupon an abrupt voltage drop began both on battery $A_1$ and battery $A_3$. Hence the battery $A_2$ is of low quality and has to be rejected. The value of the eddy current parameter $R_2''$ and the gradients of the eddy current and the ultrasonic signals for this battery substantially differ from the corresponding values obtained for batteries $A_1$ and $A_3$.

Figure 6:
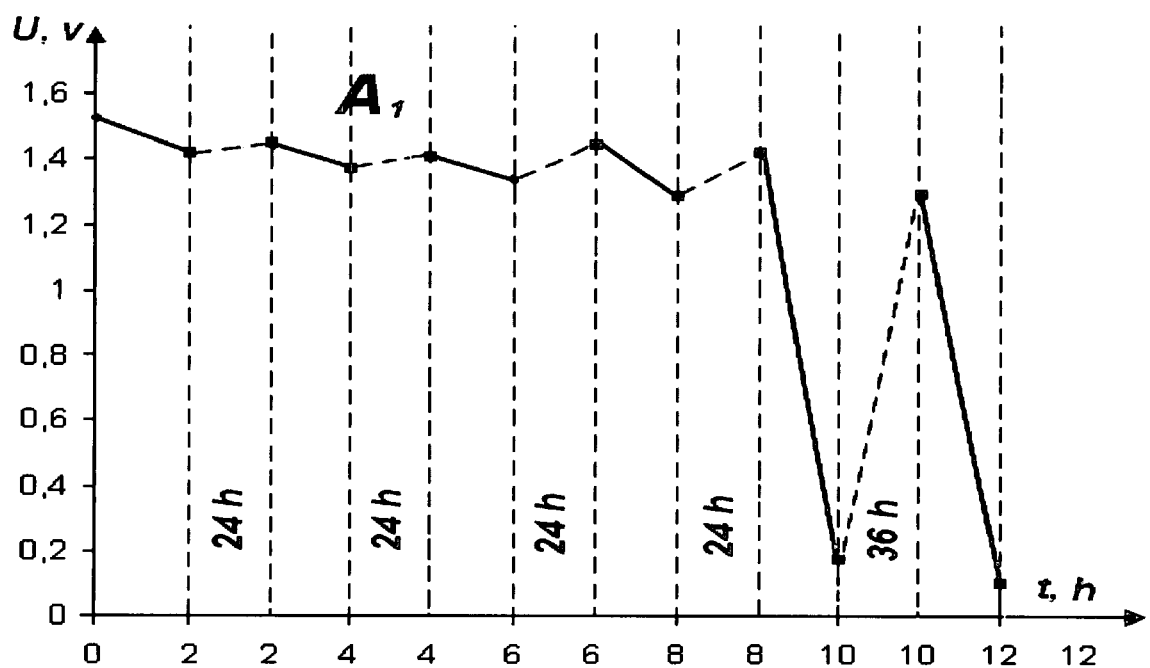
FIG. 6. Dependence of voltage on terminals of the load resistor connected to the battery of thickness T=5.4 mm ($A_1$) on the discharge time in hours. The discharge was carried out at a current of I=15 mA, with a current density of j=126 mA/in$^2$.
Figure 7:
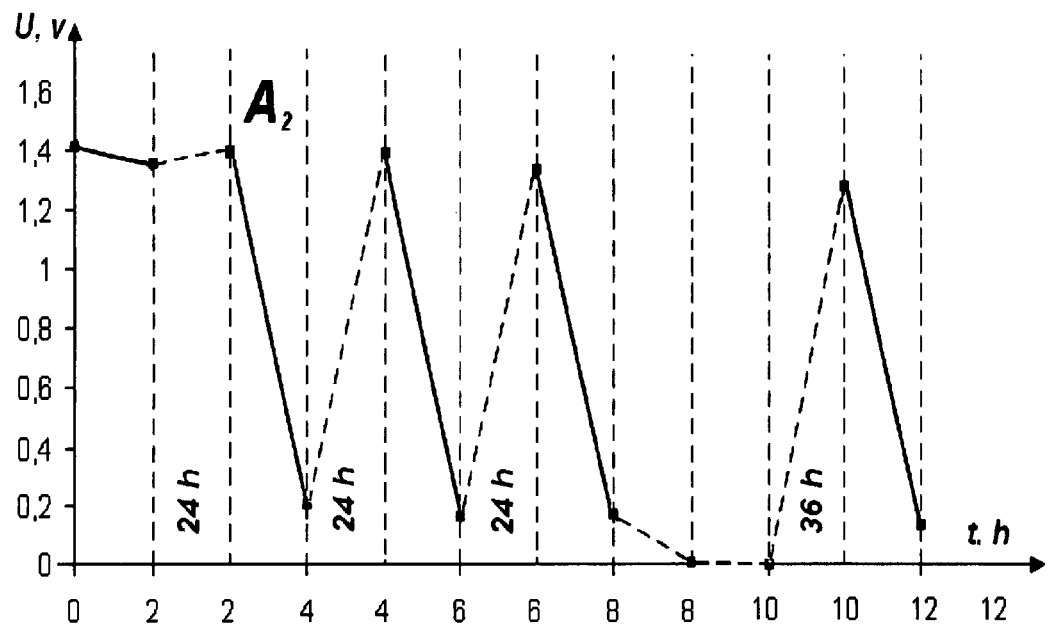
FIG. 7. Dependence of voltage on terminals of the load resistor connected to a battery of thickness T=5.4 mm ($A_2$) on the discharge time in hours. The discharge was carried out at a current of I=15 mA, with a current density of j=126 mA/in$^2$.
Figure 8:
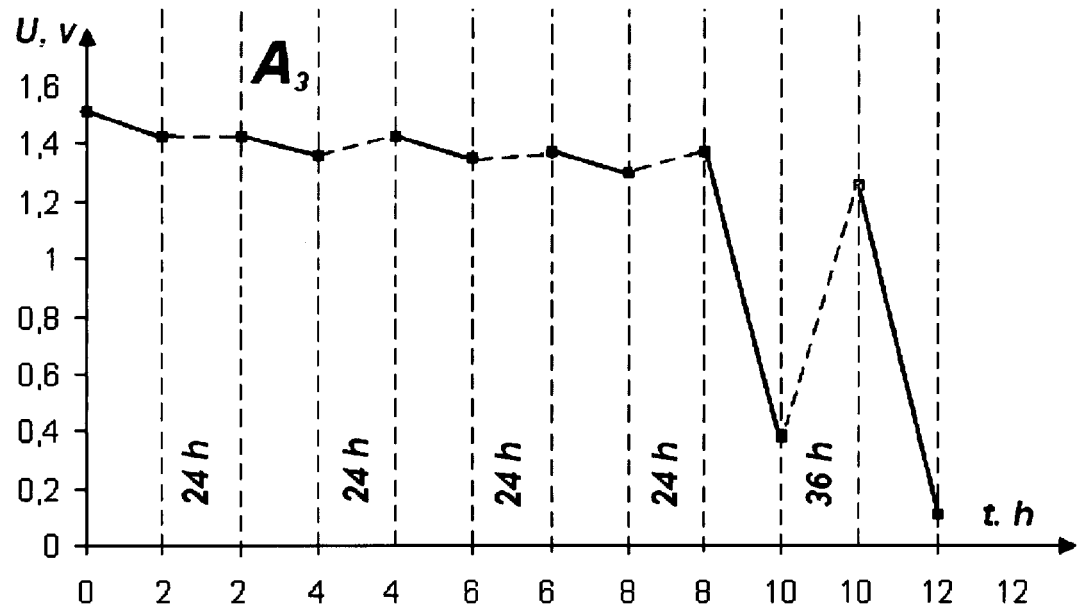
FIG. 8. Dependence of voltage on terminals of the load resistor connected to a battery of thickness T=5.4 mm ($A_3$) on the discharge time in hours. The discharge was carried out at a current of I=15 mA, with a current density of j=126 mA/in$^2$.

FIGS. 6, 7 and 8 show the dependences of voltage on terminals of the loading resistors connected to the battery of thickness T=5.4 mm ($A_1$), T=5.4 mm ($A_2$), T=5.4 mm ($A_3$) on the discharge time in hours. The discharge was carried out at a current of I=15 mA, with a current density of j=126 mA/in$^2$.

The method and device described here can be used for quality testing of other electrochemical devices comprised of current collectors, electrodes, electrolytes and an outer case or cover. The method and device of the present invention may be adapted to determine the quality of electric double layer capacitors of energy storage devices, for example.

CLOSURE

While various embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An integrated method for determining the quality of batteries comprising the steps of:
    probing of the inner volume of a battery found in initial charged state of the battery with ultrasonic pulses with a high-frequency filling by a shadow mode by using ultrasonic probes containing polyurethane protectors for ultrasonic energy injection;
    probing of the inner volume of the battery found in initial charged state of the battery with an eddy magnetic field by using first and second eddy current probes spatially integrated with emitting and receiving ultrasonic probes formed compound measuring transducers and arranged on both sides of the battery;
    artificially discharging the battery being diagnosed to a low fixed test charge value;
    using the signals of the eddy current probes for determining continuity of the discharge current during the artificial discharging process; repeating battery probing with the ultrasonic pulses after the artificial discharge;
    determining signals of the eddy current probes after the artificial discharge;
    forming a resultant eddy current signal;
    determining the deviation of the resultant eddy current signal generated at the initial state of the battery being diagnosed from an average state of the same signal preliminary obtained on a training sample of batteries;
    determining the ultrasonic signal gradient versus the battery capacity;
    determining the gradient of the resultant eddy current signal versus the battery capacity;
    determining the deviation of the ultrasonic signal gradient for the battery being diagnosed from the average state of the same gradient preliminary obtained on the training sample of batteries;
    determining the deviation of the gradient of the resultant eddy current signal for the battery being diagnosed from the average state of the same gradient preliminary obtained on the training sample of batteries;
    forming probability density functions for the deviations of the eddy current resultant signal obtained in the initial state of the battery, and the gradients of the ultrasonic and eddy current resultant signals;
    forming binary signals for the deviations of the eddy current resulting signal obtained in the initial state of the battery, and the gradients of the ultrasonic and eddy current resultant signals while using corresponding thresholds;
    determining probabilities of the obtained binary signals for the battery being diagnosed using corresponding probability density functions;
    using the obtained binary signals with their probability values and a logical rule set to determine a battery rejection probability and a battery rejection signal;
    rejecting batteries being diagnosed based on the battery rejection signal.

2. The method according to claim 1, wherein the compound measuring transducers arranged on both sides of the battery contain correspondingly an emitting and a receiving ultrasonic probes with polyurethane protectors, and parametric eddy current probes in the form of short cylindrical inductance coils, the dielectric casing of each inductance coil being coupled with the body of its respective ultrasonic probe and surround to the polyurethane protector.

3. The method according to claim 2, wherein to the outer end face of the dielectric casing of each inductance coil, a thin metallic plate is fixed in the form of a split ring and having a current tap.

4. The method according to claim 2, wherein the polyurethane protector protrudes above the level of the outer surface of the thin metallic plate fixed to the end face of the dielectric casing.

5. The method according to claim 2, wherein preliminary to the process of diagnostic on both sides of the battery, which thickness does not exceed a diameter of eddy current probe, is coaxially arranged the compound measuring transducers with emitting and receiving ultrasonic probes, whereupon the transducers are pressed to the battery to the moment when the thin metallic plates fixed to the end faces of the dielectric casings of the first and second eddy current probes come into contact with the battery.

6. The method according to claim 2, wherein the amplitudes of the ultrasonic pulses of the emitting ultrasonic probe are measured, the pulses having passed through the inner volume of the battery after the end of the process of pressing the emitting and the receiving probes to the battery, and are subsequently used as signals of the ultrasonic probes.

7. The method according to claim 2, wherein the real parts of the introduced impedances of the first and second eddy current probes are measured and compared to the self-reactance of each probe and subsequently used as signals from the eddy current probes.

8. The method according to claims 2, wherein the end of the process of pressing the emitting and the receiving ultrasonic probes to the battery body is determined according to the maximums of the real parts of the introduced impedances of the first and second eddy current probes that are subsequently used as signals of the eddy current probes.

9. The method according to claim 2, wherein the artificial discharge of the battery is carried out to a level not exceeding 1% of its capacity by connecting the current taps of the thin metallic plates fixed to the end faces of the casings of the first and second eddy current probes to the specified resistive current load during a time interval determined according to a value of artificial discharge of the battery.

10. The method according to claims 2, wherein the Fourier spectrums of the real parts of the introduced impedances of the first and second eddy current probes are determined during the battery artificial discharge process.

11. The method according to claim 2, wherein the amplitudes of the high frequency components of the Fourier spectrums are used to evaluate the contact stability of the thin metallic plates fixed to the end faces of the casings of the first and second eddy current probes with the battery.

12. The method according to claim 2, wherein a resultant eddy current signal of the first and second eddy current probes is determined in the initial state of the battery and after the artificial discharge of the battery by using the arithmetic averaging of the signals of the first and second eddy current probes.

13. The method according to claim 2, wherein from a batch of the batteries of a given type a training sample is formed containing not less than 20 batteries, by an random selection of batteries.

14. The method according to claim 2, wherein the ultrasonic and eddy current signals are measured for each battery of the training sample in their initial state and after the artificial discharge.

15. The method according to claim 2, wherein the gradient of the ultrasonic signal is determined versus the capacity for each battery of the training sample, as well as the average value of the gradient in the training sample of batteries, and the value of the root-mean-square error.

16. The method according to claim 2, wherein resultant eddy current signal in the initial state of the battery, and the gradient of the resultant eddy current signal versus the capacity for the battery are obtained for each battery of the training sample, as well as the average values of the resultant eddy current signal and the gradient of the resultant eddy current signal in the training sample of the batteries, and the value of the root-mean-square errors.

17. The method according to claim 2, wherein the batteries are selected from the training sample for which the error value for the eddy current signal obtained in the initial state of the battery, or of each gradient exceeds 20%, and the batteries are excluded from the training sample of the batteries and the total quantity of the batteries in the training sample is subsequently increased to the nominal amount.

18. The method according to claim 2, wherein from the batteries of the training sample a defect subsample of the batteries is formed containing not less than 10 batteries each of them is assigned the ordinal number.

19. The method according to claim 18, wherein the batteries of the defect subsample subjected to an artificial discharge to a specific fraction of the initial capacity of the battery, with each the fraction having a value that is proportional to ordinal number of the battery in the defect subsample.

20. The method according to claim 18, wherein, on the basis of the measurements performed on the batteries of the defect subsample, the probability density functions are formed for the deviations of the eddy current resultant signal obtained in the initial state of the battery, and the gradients of the ultrasonic and eddy current resultant signals.

21. The method according to claim 2, wherein when the deviation values of the eddy current resultant signal obtained in the initial state of the battery, and of the gradients of the ultrasonic and eddy current resultant signals exceed the corresponding thresholds, corresponding binary unit signals are formed while each binary unit signal has a probability that is determined according to the deviation value and corresponding probability density function.

22. The method according to claim 2, wherein the logical rule set for rejection of the batteries includes an operation of conjunction of the binary signals corresponded the eddy current resultant signal obtained in the initial state of the battery and the gradient of the eddy current resultant signal and an operation of disjunction of the conjunction result with the binary signal corresponded the gradient of the ultrasonic signal.

23. The method according to claim 2, wherein the battery rejection probability is determined using the probabilities of the obtained binary signals corresponded the eddy current resultant signal obtained in the initial state of the battery and gradients of the ultrasonic signal and eddy current resultant signal and of the logical rule set.

24. An apparatus for determining the quality of batteries, according to the method of claim 1, comprising:

a compound measuring transducers arranged on both sides of the battery that correspondingly contain an emitting and a receiving ultrasonic probes with polyurethane protectors, parametric eddy current probes spatially integrated with the ultrasonic probes into a single construction, as well as a thin metallic contacts for artificial discharge of the batteries;

a circuit for artificial discharging of batteries that provides connecting of the discharge contacts to a resistive load during a specified time interval;

a generator for excitation of the emitting ultrasonic probe;

a measuring circuit for the receiving ultrasonic probe;

measuring circuits for the first and the second eddy current probes;

an analog-to-digital converter;

means for forming a resultant signal of the eddy current probes;

a storage unit;

means for determining the gradient of the eddy current resultant signal;

means for determining the gradient of the ultrasonic signal;

means for comparing with thresholds and forming the binary signals;

means for determining the deviations of the resultant signal of eddy current probes in the initial state of the battery and the gradients of the eddy current resultant signal and the ultrasonic signal that are the information signals of the apparatus from the corresponding average values obtained on the training sample of batteries;

means for forming the rejection signal;

means for determining the probabilities of the formed binary signals; and means for rejecting batteries based on the rejection signal and for determining the battery rejection probability.

25. The apparatus according to claim 24, wherein the polyurethane protectors of the emitting and the receiving ultrasonic probes have the form of cylinders of identical diameter and height that are glued to the operating end faces of the probes while the common axis of symmetry of each probe with the protector is preserved.

26. The apparatus according to claim 24, wherein the protectors are made using polyurethane with a Shore hardness of 16-20 units, and are glued to the operating end faces of the ultrasonic probes with a polyurethane glue that provides an acoustic transparency at the boundary of protector-operating surface of the probe.

27. The apparatus according to claim 24, wherein to the outer surface of each ultrasonic probe a thin-wall cylindrically shaped dielectric casing is fixed that co-axially embraces the polyurethane protector with a small installation clearance between the outer surface of the protector and the inner surface of the dielectric casing.

28. The apparatus according to claim 24, wherein to the outer end face of the dielectric casing a thin metallic plate is glued in the form a split ring, while the width of the metallic plate is equal to the thickness of the casing wall and the thickness of the plate not exceed 0.5 mm.

29. The apparatus according to claim 24, wherein to the thin metallic plates of the compound measuring transducers arranged on both sides of the battery, metallic current taps are fixed that are connected to the resistive load during a time interval determined according to the value of artificial discharge of the battery.

30. The apparatus according to claims 24, wherein the polyurethane protector protrudes beyond the level of the outer surface of the thin metallic plate by a value not more than 1 mm.

31. The apparatus according to claim 24, wherein to the inputs of the analog-to-digital converter the outputs of the measuring circuits of the first and the second eddy current probes are connected, as is the measuring circuit of the ultrasonic probe.

32. The apparatus according to claim 24, wherein the output of the circuit for artificial discharging of the battery is connected to the input of the storage unit.

33. The apparatus according to claim 24, wherein to the inputs of the means for comparing with the thresholds and forming the binary signals are connected to the outputs of the means for forming the resultant signal of the eddy current probes accorded of the initial state of the battery and means for determining the gradients of the eddy current resultant signal and ultrasonic signal.

34. The apparatus according to claim 24, wherein the outputs of the means for forming the resultant signal of the eddy current probes accorded of the initial state of battery and means for determining the gradients of the eddy current resultant signal and means for determining the gradient of the ultrasonic signal are connected to the inputs of the means for determining the deviations of the information signals from the corresponding average values obtained on the training sample of the batteries.

35. The apparatus according to claim 24, wherein the outputs of the means for comparing with the thresholds and forming the binary signals are connected to the inputs of the means for forming the rejection signal.

36. The apparatus according to claim 24, wherein the inputs of the means for determining the probabilities of the formed binary signals are connected to the outputs of the means for determining the deviations of the information signals from the corresponding average values obtained on the training sample of the batteries.

37. The apparatus according to claim 24, wherein the inputs of the means for rejecting the batteries and determining the battery rejection probability are connected to the outputs of the means for forming the rejection signal and means for determining the probabilities of the formed binary signals.

\* \* \* \* \*